United States Patent
Mathis et al.

(10) Patent No.: US 8,766,619 B2
(45) Date of Patent: Jul. 1, 2014

(54) COAX RIBBONIZING HEADER

(75) Inventors: Bruce Mathis, Tucson, AZ (US); Ethan Mork, Young America, MN (US)

(73) Assignee: Technical Services For Electronics, Inc., Arlington, MN (US)

( * ) Notice: Subject to any disclaimer, the term of this patent is extended or adjusted under 35 U.S.C. 154(b) by 241 days.

(21) Appl. No.: 13/214,629

(22) Filed: Aug. 22, 2011

(65) Prior Publication Data

US 2013/0049731 A1 Feb. 28, 2013

(51) Int. Cl.
*G01R 19/00* (2006.01)

(52) U.S. Cl.
USPC .......................................................... 324/66

(58) Field of Classification Search
CPC .... G01R 31/02; G01R 31/021; G01R 31/022; G01R 31/023; G01R 31/04; G01R 31/041; G01R 31/043; G01R 31/045
USPC ............................................ 324/66; 439/394
See application file for complete search history.

(56) References Cited

U.S. PATENT DOCUMENTS

| | | | |
|---|---|---|---|
| 4,654,580 A | | 3/1987 | Keller |
| 4,697,862 A | * | 10/1987 | Hasircoglu .................. 439/404 |
| 4,804,342 A | * | 2/1989 | Rudy et al. .................. 439/467 |
| 5,017,149 A | | 5/1991 | Hatanaka |
| 5,027,074 A | * | 6/1991 | Haferstat .................... 324/539 |
| 5,565,784 A | * | 10/1996 | DeRenne .................... 324/527 |
| 6,043,663 A | * | 3/2000 | Kapusta ..................... 324/539 |
| 6,344,748 B1 | | 2/2002 | Gannon |
| 6,580,034 B2 | | 6/2003 | Daane et al. |

FOREIGN PATENT DOCUMENTS

EP 0951092 A2 * 10/1999

OTHER PUBLICATIONS

Multimeter, available at http://en.wikipedia.org/wiki/Multimeter on Dec. 5, 2013.*
Electrician Test Phone, available Feb. 2, 2011 at http://www.test-phones.com/.*
International Search Report, dated Dec. 31, 2012, corresponding to International Application No. PCT/US2012/045210, filed Jul. 2, 2012.

* cited by examiner

*Primary Examiner* — Melissa Koval
*Assistant Examiner* — Daniel Miller
(74) *Attorney, Agent, or Firm* — RatnerPrestia

(57) ABSTRACT

Disclosed herein is a system and method for identifying individual coaxial cables in a bundle of coaxial cables. The system includes a coaxial cable header that is configured for receiving one or more coaxial cables and establishing electrical conductive contact with only a conductive shield on a first end of each cable. The system also includes an electrical tester that is electrically connected to the coaxial cable header such that the electrical tester is configured to transmit signals through the conductive shields of each cable. The electrical tester includes a test probe that is configured to be selectively connected to a second end of each cable. The electrical tester is configured to identify whether the second end of a particular cable that is connected to the test probe corresponds with the first end of a pre-determined cable that is within the coaxial cable header.

7 Claims, 3 Drawing Sheets

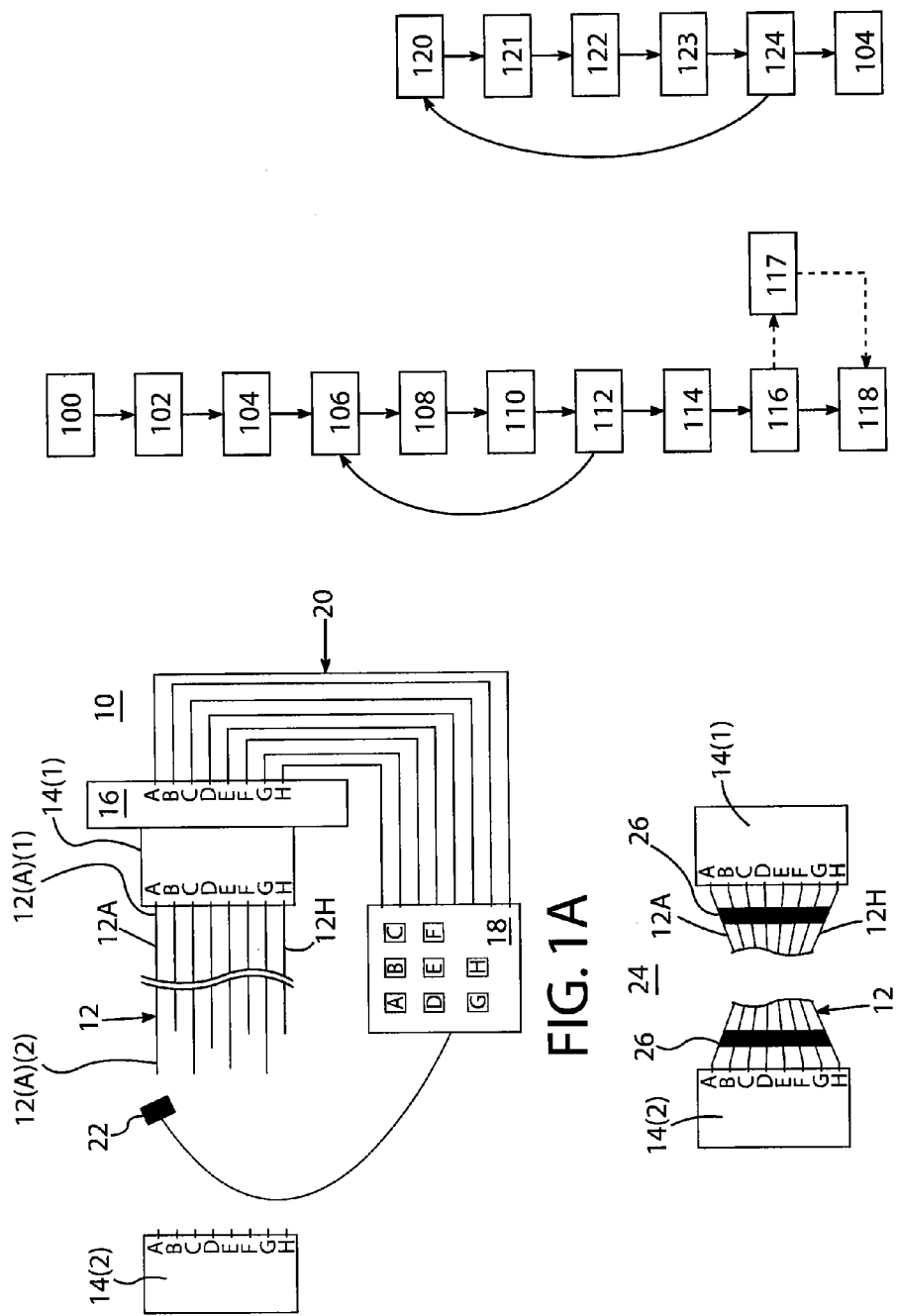

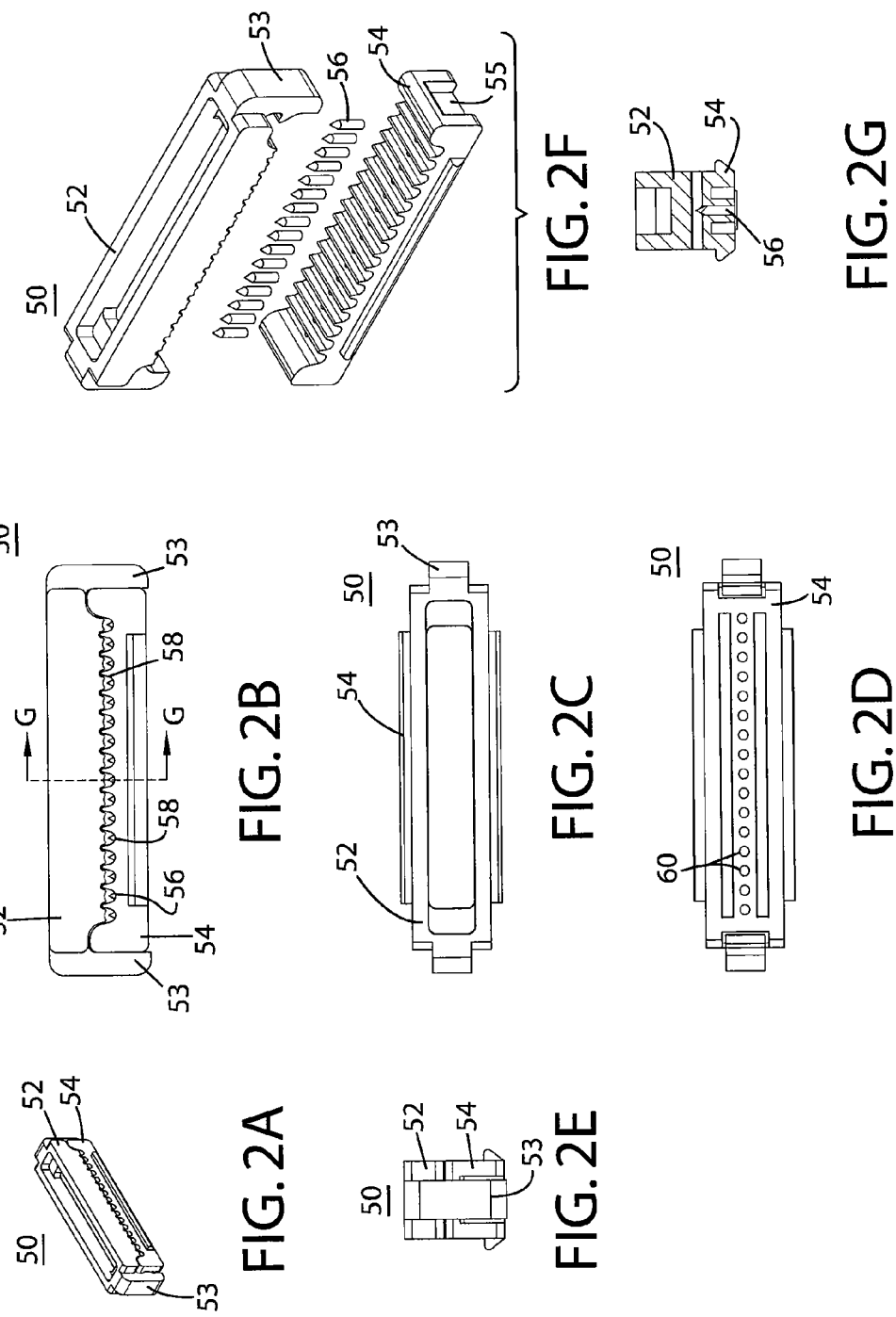

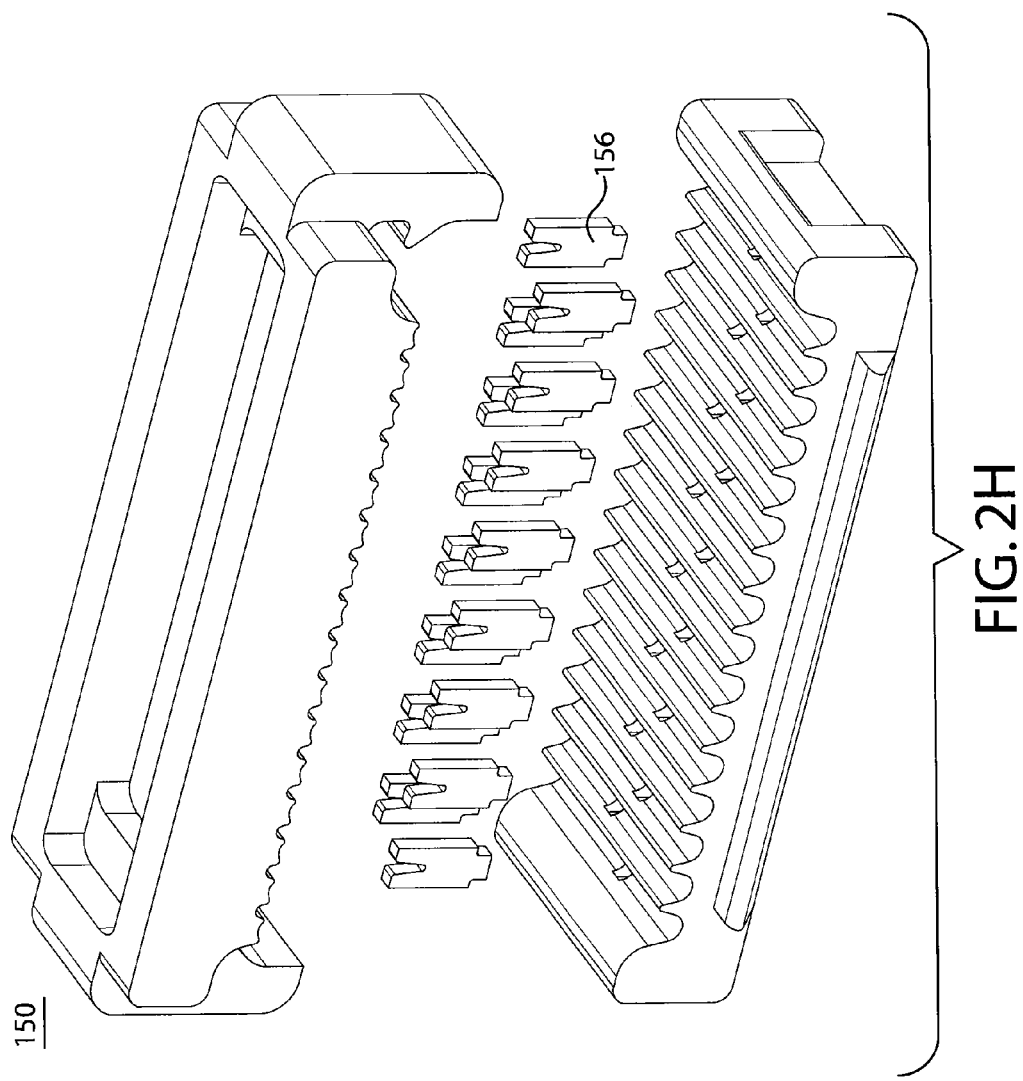

COAX RIBBONIZING HEADER

FIELD OF THE INVENTION

The present invention relates to a header for ribbonizing a coax cable, and a method of assembling and ribbonizing a coax cable.

BACKGROUND OF THE INVENTION

As described in U.S. Pat. No. 6,580,034, which is incorporated by reference, certain demanding applications require miniaturized multi-wire cable assemblies. To avoid undesirably bulky cables when substantial numbers of conductors are required, very fine conductors are used. Coaxial wires having shielding are commonly used for the conductors to limit electrical noise and interference. In a coaxial wire, a central conductor is encapsulated by a dielectric sheath, the dielectric sheath is surrounded by a conductive shielding brade and the conductive shielding brade is encapsulated by an outer jacket. A bundle of such wires is surrounded by a conductive braided shield, and an outer protective sheath (see FIG. 4 of U.S. Pat. No. '034).

Some applications requiring many different conductors prefer that a cable be very flexible, supple, or "floppy." In an application such as a cable for connection to a medical ultrasound transducer, a stiff cable with even moderate resistance to flexing can make ultrasound imaging difficult. However, with conventional approaches to protectively sheathing cables, the bundle of wires may be undesirably rigid.

Cable assemblies having a multitude of conductors may be time-consuming and expensive to assemble with other components. When individual wires are used in a bundle, one can not readily identify which wire end on a first end of a cable bundle corresponds to a selected wire at the second end of the cable bundle, requiring tedious continuity testing. Normally, the wire ends at the first end of the cable bundle are connected to individual pads on a connector or printed circuit board, the shields at the first end are connected to a common ground pad on the connector or printed circuit board, and the connector or board is connected to a test facility that energizes each wire, one-at-a-time, so that an assembler can connect the identified wire end to the appropriate connection on a second connector or board.

However, because the shields are connected to the same ground pad at the first end of the cable bundle, false identifications can occur where more than one center conductor is shorted to a conductive shield at the second end of the cable. Center conductors are often shorted to their own shields through the act of cutting the coax cables to a specified length which crushes the cable ends so that the center conductors and strands of the conductive shield can make contact. Clearing the shorts and/or re-terminating the cables is time consuming and can damage the coax cable.

The device disclosed herein allows for identification using individual shields before the coaxial cables are terminated and ganged together.

SUMMARY OF THE INVENTION

According to one aspect of the invention, a header for a coaxial cable assembly is provided. The coaxial cable assembly comprises a first housing portion that is configured for receiving a plurality of coaxial cables; a second housing portion for mating with the first housing portion to capture the plurality of coaxial cables received by the first housing portion; and a plurality of contacts mounted to either the first housing portion or the second housing portion that are each configured to pierce an outer jacket and contact a conductive shield of a respective coaxial cable upon mating the first housing portion with the second housing portion.

According to another aspect of the invention, a system for identifying individual coaxial cables in a bundle of coaxial cables is provided. The system comprises a coaxial cable header that is configured for receiving one or more coaxial cables and establishing electrical conductive contact with a conductive shield on a first end of each cable; and an electrical tester that is electrically connected to the coaxial cable header such that the electrical tester is configured to selectively transmit signals through the conductive shields of each cable. The electrical tester includes a test probe that is configured to be selectively connected to a second end of each cable. The electrical tester is configured to identify whether the second end of a particular cable that is connected to the test probe corresponds with the first end of the cable to which a signal is applied by the electrical tester.

According to yet another aspect of the invention, a method for identifying individual coaxial cables in a bundle of coaxial cables is provided. The method comprises the steps of: (a) mounting first ends of a plurality of coax cables in respective slots of a coaxial cable header; (b) establishing electrical conductive contact between the cables and the coaxial cable header; (c) electrically connecting the coaxial cable header to an electrical tester; (d) transmitting a signal through a first end of a pre-determined cable of the bundle of coaxial cables that is mounted to the coaxial cable header by way of the electrical tester; (e) connecting a test probe of the electrical tester to a second end of each cable of the bundle of coaxial cables; and (f) identifying whether the second end of a particular cable of the cable bundle that is connected to the test probe corresponds with the pre-determined cable through which the signal is transmitted by way of the electrical tester.

BRIEF DESCRIPTION OF THE DRAWINGS

FIG. 1A is a schematic view of a coax cable identification system according to one aspect of the invention.

FIG. 1B depicts a coax cable assembly according to another aspect of the invention.

FIGS. 2A-2F depict perspective, front elevation, top plan, bottom plan, side elevation and exploded views of a coax ribbonizing header, according to one exemplary embodiment of the invention.

FIG. 2G is a cross-sectional view of the header of FIG. 2B taken along the lines 2G-2G.

FIG. 2H depicts an exploded view of another coax ribbonizing header, according to another exemplary embodiment of the invention.

FIG. 3 depicts a schematic diagram of a process for identifying individual coax cables in a bundle of coax cables according to yet another aspect of the invention.

FIG. 4 depicts a schematic diagram of a process for identifying individual coax cable groups in a bundle of coax cables according to still another aspect of the invention.

DETAILED DESCRIPTION OF THE INVENTION

Referring now to FIGS. 1A and 3, FIG. 1A depicts a schematic view of a system for identifying individual coax cables in a bundle of coax cables, whereas FIG. 3 depicts a method of identifying individual coax cables in a bundle of coax cables. The system 10 of FIG. 1A comprises a bundle of eight discrete coaxial cables 12A-12H (referred to collectively as cables 12 or individually as cable 12), two coax ribbonizing headers 14(1) and 14(2), a plug 16 that is mechanically and electrically connected to the header 14, a multi-channel electrical tester 18 that is electrically connected to the plug 16 by a series of wires 20.

The headers 14(1) and 14(2) are structurally and functionally equivalent. The header 14(2) is shown detached from the cables 12 in FIG. 1A. The headers 14 are described in greater detail with reference to FIGS. 2A-2G. The system 10 provides a rapid and convenient way to identify the cables 12 using the headers 14 and the multi-channel electrical tester 18.

According to one exemplary embodiment of the invention, the electrical tester 18 is a multi-channel continuity tester. The electrical tester 18 may, however, vary from that which is shown and described. For example, the electrical tester 18 may be a multi-meter or a volt meter. The electrical tester 18 may have any number of channels, including a single channel. The electrical tester 18 may be configured to transmit and measure resistance, capacitance, voltage, signal frequency, signal waveform, or signal amplitude values, for example, across each cable 12.

Described hereinafter is an exemplary method of utilizing the system 10 to identify individual coax cables 12 in the bundle of coax cables. It should be understood that the method is not limited to any particular step or sequence of steps and may vary from that which is shown and described hereinafter.

According to the exemplary method, at step 100, the header 14(1) is mechanically and electrically connected to the plug 16 such that the channels A-H of header 14(1) are connected to the channels A-H of the plug 16, respectively. Although not shown, the plug 16 may have pins or sockets that engage with sockets or pins, respectively, of the header 14(1) in order to accomplish the connection.

At step 102, the plug 16 is electrically connected to the electrical tester 18 by a series of wires 20 such that the channels A-H of the plug 16 are electrically connected to the channels A-H of the electrical tester 18.

At step 104, the first end of each cable 12 (e.g., end 12(A)(1) of cable 12A) is fixedly positioned in a respective channel port A-H of the header 14(1). The cables 12 are not connected to the header 14(1) in any particular order. Upon positioning each cable in the header 14(1), the header 14(1) is electrically connected to the conductive shielding of the cables 12. More particularly, as described in greater detail with reference to FIGS. 2A-2G, the header 14(1) has sixteen contacts that are each positioned within a respective channel port A-H of the header 14(1). Each contact is associated with a respective cable 12 that is fixedly positioned in the header 14(1). Each contact of the header 14(1) either displaces or pierces the outer jacket of a respective cable 12 and contacts the conductive shielding of the respective cable 12. The contacts of the header 14(1) are electrically isolated from each other.

By virtue of the interconnection of cables 12, header 14(1), plug 16, electrical tester 18, and wires 20, the cable 12A is electrically connected to channel A of the electrical tester 18, the cable 12B is electrically connected to channel B of the electrical tester 18, and so forth.

At step 106, the electrical tester 18 transmits a signal through the shielding of one predetermined cable 12 that is connected to the header 14(1).

At step 108, the test probe 22 (e.g., an Alligator Clip) of the electrical tester 18 is then manually coupled one at a time to the second ends of the cables 12 (e.g., end 12(A)(2) of cable 12A) until the test probe 22 is coupled to the pre-determined cable which receives the signal that is transmitted by the electrical tester 18 at step 106. It should be understood that the test probe 22 is not coupled to the cables 12 in any particular order, and the test probe 22 is connected to one cable at a time.

At step 110, the electrical tester 18 alerts the operator that the cable end that is coupled to the test probe 22 is the pre-determined cable which receives the signal that is transmitted by the electrical tester 18 at step 106. The electrical tester 18 is configured to make this determination based upon resistance, capacitance, voltage, signal frequency, signal waveform, or signal amplitude values, for example, transmitted through the cable. It should be understood that once the electrical tester 18 is electrically connected to both ends of the predetermined cable, a circuit is completed and an alert is triggered by the electrical tester 18. For example, if a signal is applied to cable end 12(A)(1) by the electrical tester 18, then once the operator couples the test probe 22 to the cable end 12(A)(2), the electrical tester 18 will alert the operator that the coupled cable is cable 12A. The operator then knows which cable 12A-12H of the cable bundle is coupled to the test probe 22.

To alert the operator, the electrical tester 18 includes means for alerting (labeled A-H on the electrical tester 18) that both ends of a particular cable 12 are electrically coupled to the electrical tester 18, thereby completing a circuit. The means for alerting may be visual in the form of a light and/or audible in the form of a buzzer, for example.

At step 112, the operator inserts the second end of the identified cable 12 into the proper channel port A-H on the other header 14(2) based upon the known position of the first end of the predetermined cable in header 14(1). For example, once cable end 12(A)(2) of cable 12A is identified as cable 12A, the operator inserts the cable end 12(A)(2) of cable 12A into channel port A of the header 14(2). Alternatively, the operator may insert the cable end 12(A)(2) of cable 12A into channel port H of the header 14(2) to reverse-wire the headers 14(1) and 14(2), if so desired. This process is repeated (as indicated by the reverse arrow from step 112 to step 106 in FIG. 3) until all eight cables 12A-12H of the cable bundle are identified and positioned in the other header 14(2).

At step 114, once the second end of all of the cables 12 have been positioned in their respective channel ports A-H on the other header 14(2), the operator closes the header 14(2) to fix the positions of the cables 12A-12H in the header 14(2). At step 116, the plug 16 is disconnected from the header 14(1), the cable assembly is installed into a fixture (not shown), and the ends of the cables are soldered together, as represented by item 26 in FIG. 1B. Soldering the ends of the cables permanently fixes the position of the cables 12A-12H relative to each other. What remains is a cable assembly 24 including two headers 14(1) and 14(2) and the discrete cables 12, as shown in FIG. 1B.

At step 117, the cable assembly 24 is packaged and provided to an end user as a sub-assembly. Once received, the end user perform step 118, which is described hereinafter. Step 117 is an optional step of this exemplary process.

At step 118, the headers 14(1) and 14(2) are removed from the cable assembly 24 and the ends of the cables are stripped to expose the conductor and the shield of each cable 12. Thereafter, both ends of the cable assembly (without the headers 14) are mounted to one or more circuit boards by an end user or packaged and provided to an end-user as a sub-assembly.

The cable assembly 24 of FIG. 1B includes a single group of cables, i.e., cables 12A-12H. If the cable assembly includes multiple groups of cables, then the cable groups are identified prior to identifying the individual cables of each group. To identify the different cable groups, the groups of conductors may simply be distinguished at the time that the cable is created by using color coded cables, wrapping cable groups in colored tape or string, or staggering the cable groups, for example. If the coaxes are grouped at the time of cabling, then the identification process can proceed directly to step 100 of FIG. 3. However, if the cable groupings are not identified at the time the cables are created, then additional steps are required, as described hereinafter.

FIG. 4 depicts a schematic block diagram of a process for identifying individual coax cable groups in a bundle of coax cables according to still another aspect of the invention. It should be understood that, unlike the cable bundle of FIG. 1A, the cable bundle described with reference to FIG. 4 would include more than eight cables.

At step 120, eight individual coax cables 12A-12H are selected from the cable bundle at random and the first ends of those cables 12A-12H are placed in the header 14(1). The selected cables 12A-12H represent the first group of cables.

At step 121, the header 14(1) is then mechanically and electrically connected to the plug 16 and the plug 16 is electrically connected to the electrical tester 18 as previously described. Step 121 may occur either before or after step 120.

At step 122, the electrical tester 18 transmits a signal through the shielding of each of the cables 12A-12H of the first group of cables that is connected to the header 14(1). At step 123, the test probe 22 (e.g., an Alligator Clip) of the electrical tester 18 is manually coupled one at a time to the second ends of the cables in the cable bundle at random. At step 124, the electrical tester 18 alerts the operator as to whether the particular cable that is coupled to the test probe 22 belongs to the first cable group 12A-12H. The electrical tester 18 is configured to make this determination based upon resistance, capacitance, voltage, signal frequency, signal waveform, or signal amplitude values, for example, transmitted through the cables. Once identified as belonging to the first cable group, the individual cables of the first group are segregated from the remaining cable of the bundle and marked to distinguish the first group from the remaining groups.

This process is repeated for all of the cable groups, as indicated by the reverse arrow from step 123 to step 120, until every cable of the cable bundle has been assigned to a cable group by the operator. Thereafter, the process returns to step 104 of FIG. 3 and the process of FIG. 3 continues as previously described so that the second end of every cable of every cable group is positioned in the proper channel port A-H of a header 14. It should be understood that each cable group requires two headers, thus the first cable group utilizes headers 14(1) and 14(2), whereas the second cable group utilizes two different headers 14 (not shown).

Modifications may be made to the system 10 without departing from the scope or the spirit of the invention. For example, the plug 16, electrical tester 18, and wires 20 may be a pre-assembled unit.

Additionally, the plug 16 and the wires 20 are optional components of the system. For example, according to another exemplary embodiment of the invention, the header 14 is directly connected to the multi-channel electrical tester 18 (by pins and sockets, for example), and the plug 16 and wires 20 are omitted. According to yet another exemplary embodiment of the invention, the wires 20 are directly connected to both the header 14 and the electrical tester 18, and the plug 16 is omitted.

The number of cables in the bundle may vary depending upon the particular application. The number of headers 14 may also vary. For example, two eight-position headers 14 maybe used to accommodate sixteen cables. It should be understood that the cables are not limited to coaxial cables, and may be any cable that is suited for any particular application.

FIGS. 2A-2F depict perspective, front elevation, top plan, bottom plan, side elevation and exploded views of a coax ribbonizing header 50, according to one exemplary embodiment of the invention. FIG. 2G is a cross-sectional view of the header 50 of FIG. 2B taken along the lines 2G-2G. The header 50 is similar to the header 14 that was described with reference to FIGS. 1A and 1B, with the exception that header 50 accommodates sixteen cables whereas header 14 accommodates eight cables.

The header 50 generally comprises a top housing portion 52 that is releasably mounted to a bottom housing portion 54. The housing portions 52 and 54 are releasably mated together by a clip 53 on the top portion 52 that engages a recess 55 formed on the bottom housing portion 54. In a mated condition of the header 50, a series of sixteen recesses or slots 58 are defined between semi-circular cutouts defined on respective housing portions 52 and 54 of the header 50 (see FIG. 2B). The recesses 58 are sized to accommodate a cable (not shown) having a wire gauge range of 38-46 AWG.

A series of contacts 56 are positioned in recesses 60 that are defined through the thickness of the housing portion 54 of the header 50. The header 50 includes sixteen contacts 56, i.e., one contact 56 per recess 58. As best shown in FIG. 2B, the sharp end of each contact 56 extends into its respective recess 58 of the header 50 by a distance that is sufficient to pierce the outer jacket and contact the conductive shield of a cable that is positioned in the respective recess 58.

To assemble the cables into the header 50, the cables are first positioned in the semi-circular channels of the housing portion 54 of the header. The housing portion 52 is mated to the housing portion 54 by snapping the clips 53 into respective recesses 55. By mating the housing portions 52 and 54 together, each contact pierces the outer jacket and contacts the conductive shield of a cable that is positioned in a respective recess 58. The cables are electrically isolated from each other because the contacts 56 are electrically isolated from each other.

Although not shown in FIGS. 2A-2G, the recesses 60 of the header 50 are sized to receive contacts on a plug that is similar to plug 16 of FIG. 1A. Upon inserting the contacts on a plug into the recesses 60 of the header 50, electrical contact is established between the plug and the individual channels of the header 50. The contacts 56 may vary from that shown and described. For example, the contacts 56 may include a socket on the end that is opposite its sharp end for receiving a contact of the plug.

As noted above, the contacts 56 may vary from that shown and described. FIG. 2H depicts an exploded view of another coax ribbonizing header 150, which includes different contacts than the coax ribbonizing header 50 of FIGS. 2A-2F. Other than the contacts, the coax ribbonizing headers 50 and 150 are substantially the same. The contacts 156 of the coax ribbonizing header 150 are blade-style contacts. Each contact 156 includes a sharp v-shaped edge for either displacing or piercing the outer jacket of a respective cable 12.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed:

1. A method for identifying individual coaxial cables in a bundle of disconnected coaxial cables, each coaxial cable comprising a center conductor and an associated conductive shield, said method comprising the steps of:
   (a) mounting first ends of a plurality of discrete coaxial cables in respective slots of a coaxial cable header, each slot comprising a single isolated contact to electrically connect with only the conductive shield of the discrete coaxial cable mounted in the slot, the center conductor of the discrete coaxial cable remaining electrically unconnected to the coaxial cable header;
   (b) establishing electrical conductive contact between the conductive shield of each discrete coaxial cable and the corresponding isolate contact of the coaxial cable header;
   (c) electrically connecting the coaxial cable header to an electrical tester;
   (d) transmitting a signal through a first end of the conductive shielding of a pre-determined discrete coaxial cable of the bundle of coaxial cables that is mounted to the coaxial cable header by way of the electrical tester;
   (e) connecting a test probe of the electrical tester to a second end of the conductive shielding of each discrete coaxial cable of the bundle of coaxial cables;
   (f) identifying whether the second end of the conductive shielding of a particular discrete coaxial cable of the cable bundle that is connected to the test probe corresponds with the conductive shielding of the pre-determined discrete coaxial cable through which the signal is transmitted by way of the electrical tester;
   (g) mounting the second end of the pre-determined discrete coaxial cable in a slot of another coaxial cable header when said correspondence is identified, said another coaxial cable header identical to the coaxial cable header; and
   (h) repeating steps (d) through (f) until every slot of said another coaxial cable header is occupied with a discrete coaxial cable.

2. The method of claim 1 further comprising the step of soldering the cables together to preserve the ordering of the coax cables.

3. The method of claim 1, wherein step (c) further comprises electrically isolating the cables from each other.

4. The method of claim 1, wherein after step (c) and before step (d), the method further comprises step of:
   (c1) transmitting a signal through every cable mounted to the coaxial cable header.

5. The method of claim 4 further comprising the steps of:
   (c2) identifying whether the second end of a particular cable that is connected to the test probe corresponds with the cables through which the signal is transmitted; and
   (c3) repeating step (c2) until all of the cables mounted to the coaxial cable header have been identified.

6. The method of claim 5 wherein the cable bundle of steps (d)-(f) comprise the cables identified at step (c3).

7. A method for identifying individual coaxial cables in a bundle of disconnected coaxial cables, each coaxial cable comprising a center conductor and an associated conductive shield, said method comprising the steps of:
   (a) mounting first ends of a plurality of discrete coaxial cables in respective slots of a coaxial cable header, each slot comprising a single isolated contact to electrically connect with only the conductive shield of the discrete coaxial cable mounted in the slot, the center conductor of the discrete coaxial cable remaining electrically unconnected to the coaxial cable header;
   (b) establishing electrical conductive contact between the conductive shield of each discrete coaxial cable and the corresponding isolated contact of the coaxial cable header;
   (c) electrically connecting the coaxial cable header to an electrical tester;
   (d) connecting a test probe of the electrical tester to a second end of the conductive shield of a pre-determined discrete coaxial cable of the bundle of coaxial cables;
   (e) transmitting a signal through the conductive shield of the pre-determined discrete coaxial cable of the bundle of coaxial cables using the electrical tester;
   (f) correlating the conductive shield of the second end of the pre-determined discrete coaxial cable with the conductive shield of the first end of the pre-determined discrete coaxial cable that is mounted in the coaxial cable header;
   (g) mounting the second end of the pre-determined discrete coaxial cable in a slot of another coaxial cable header based on said correlation, said another coaxial cable header identical to the coaxial cable header; and
   (h) repeating steps (d) through (f) until every slot of said another coaxial cable header is occupied with a discrete coaxial cable.

* * * * *